(12) United States Patent
Watanabe

(10) Patent No.: US 6,432,836 B1
(45) Date of Patent: Aug. 13, 2002

(54) CLEANING METHOD FOR SEMICONDUCTOR SUBSTRATE AND CLEANING SOLUTION

(75) Inventor: Kaori Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/393,686

(22) Filed: Sep. 10, 1999

(30) Foreign Application Priority Data

Sep. 17, 1998 (JP) .............................. 10-263482

(51) Int. Cl.⁷ .............................. H01L 21/302
(52) U.S. Cl. .................. 438/745; 438/754; 438/756; 438/757; 252/79.1; 252/79.2; 252/79.3
(58) Field of Search ..................... 438/745, 754, 438/756, 757; 252/79.1–79.3

(56) References Cited

U.S. PATENT DOCUMENTS

| | | | | |
|---|---|---|---|---|
| 4,398,344 A | * | 8/1983 | Gould | 29/590 |
| 4,804,438 A | * | 2/1989 | Rhodes | 156/653 |
| 5,258,093 A | * | 11/1993 | Maniar | 156/626 |

FOREIGN PATENT DOCUMENTS

| | | | |
|---|---|---|---|
| JP | 3-228327 | * | 10/1991 |
| JP | 5-006884 | * | 1/1993 |
| JP | 6-333898 | * | 12/1994 |
| JP | 7-045580 | * | 2/1995 |
| JP | 7-130702 | * | 5/1995 |
| JP | 7-193035 | * | 7/1995 |
| JP | 8-031781 | * | 2/1996 |

* cited by examiner

Primary Examiner—Benjamin L. Utech
Assistant Examiner—Charlotte A. Brown
(74) Attorney, Agent, or Firm—Young & Thompson

(57) ABSTRACT

The present invention relates to a cleaning solution which can reliably remove the platinum group metal (e.g. Pt or Ir) contaminants adhering on the silicon-based insulating film (e.g. silicon oxide film) formed on a semiconductor substrate and further can prevent the readhesion of the removed contaminants, as well as to a cleaning method using said cleaning solution. Since the cleaning solution consists of HPFM or SPFM which is a mixture of a hydrochloric acid-hydrogen peroxide (HPM) or sulfuric acid-hydrogen peroxide (SPM) solution with a very small amount of hydrofluoric acid, the contaminants adhering on the silicon-based insulating film can be reduced to a level lower than $1 \times 10^{10}$ atoms/cm².

11 Claims, 2 Drawing Sheets

CLEANING METHOD FOR SEMICONDUCTOR SUBSTRATE AND CLEANING SOLUTION

BACKGROUND OF THE INVENTION

1. Field of the Invention

The present invention relates to a cleaning solution for semiconductor substrate and a cleaning method using said cleaning solution. More particularly, the present invention relates to a cleaning solution used for removing the platinum group metal (e.g. Pt or Ir) contaminants adhering on the insulating film formed on a semiconductor substrate, as well as to a cleaning method using said cleaning solution.

2. Description of the Related Art

In recent years, memory cells such as DRAM and the like have become increasingly finer. Meanwhile, memory cells using a conventional dielectric film such as nitride film or oxide film are unable to have a sufficient capacity because such a dielectric film has a dielectric constant of only about 2 to 3. To solve this problem, a ferroelectric film of perovskite type, made of barium titanate, strontium titanate, barium strontium titanate or the like has come to be used. When such a ferroelectric film is in direct contact with a substrate, the substrate is oxidized, making large the capacity of memory cell. Therefore, in using such a ferroelectric film, it has become common to use a lower-level capacitive electrode made of a platinum group metal (e.g. Pt or Ir) not reactive with the ferroelectric. An example of use of a lower-level capacitive electrode made of a platinum group metal is shown in FIG. 3 illustrating a key portion sectional view of a semiconductor memory device wherein data storage is made by charge accumulation using a combination of a MOS transistor and a capacitive part.

In FIG. 3, a capacitive part 12 is constituted by a ferroelectric film 10, an upper-level platinum thin film 11 and a lower-level platinum thin film 9. The lower-level platinum thin film 9 provided beneath the ferroelectric film 10 is connected to one of diffusion layers 2 of a MOS transistor via a vertical interconnect 6, and the upper-level platinum thin film 11 provided on the ferroelectric film 10 is connected to a metal wiring 13. The MOS transistor (including diffusion layers 2 and a gate electrode 4 formed on a channel region between the diffusion layers 2, via a gate insulating film 3) provided on a silicon substrate 1 is covered with a first inter-layer insulating film 5; and the capacitive part 12 formed on the first inter-layer insulating film 5 is covered with a second inter-layer insulating film 7. In the opening formed in the second inter-layer insulating film 7, the upper-level platinum thin film 11 is connected to the metal wiring 13; and the metal wiring 13 and the second inter-layer insulating film 7 are covered with a third inter-layer insulating film 8.

In producing a semiconductor memory device as shown in FIG. 3, when the second inter-layer insulating film 7 is formed, for example, so as to cover the capacitive part 12, platinum atoms or particles vaporize from the upper platinum thin film 11 of the capacitive part 12 and remain in the atmosphere gas inside the apparatus used for formation of second inter-layer insulating film or on the inner wall of the apparatus; these platinum atoms or particles adhere on the formed second inter-layer insulating film 7 or on the back side of the silicon substrate 1 and, when left as they are, give very harmful effects on the properties of the semiconductor memory device produced. When the above-mentioned apparatus once used for formation of second inter-layer insulating film is again used for formation of insulating film on silicon substrate for other semiconductor memory device, similar problems arise because the platinum atoms or particles remaining in the apparatus come to adhere on the insulating film or on the back side of the silicon substrate. It is known that remaining of platinum atoms or particles of about $1 \times 10^{10}$ atoms/cm$^2$ gives an adverse effect on the life and electrical properties of the semiconductor memory device produced.

Such contaminants include (1) metal ions adsorbed by or bonded with the surface of a semiconductor substrate or the surface of the insulating film (e.g. silicon oxide film) formed on a semiconductor substrate and (2) metal particles adhering on said surface.

In production of a semiconductor memory device, there is a case that one common cleaning bath is used in an ordinary cleaning operation after the step for formation of platinum group metal film and in an ordinary cleaning operation after other step. In such a case, when the cleaning bath is used for cleaning of a substrate contaminated with a platinum group metal and successively used for cleaning of other substrate, secondary contamination may take place in the other substrate. Therefore, it is necessary that the platinum group metal contaminants are beforehand removed from the former substrate. Such handling of a contaminated substrate and other substrate in one common apparatus is conducted in various steps of semiconductor memory device production, such as oxide film formation step in addition to cleaning step.

As conventional metal-removing solutions, there are known, for example, hydrochloric acid-hydrogen peroxide-water (HCl—H$_2$O$_2$—H$_2$O, i.e. HPM), sulfuric acid-hydrogen peroxide-water (H$_2$SO$_4$—H$_2$O$_2$—H$_2$O, i.e. SPM), nitric acid and hydrochloric acid (aqua regia), and ammonia water-hydrogen peroxide-water (NH$_4$OH—H$_2$O$_2$—H$_2$O, i.e. APM). These conventional metal-removing solutions, however, are generally for removal of heavy metals and unable to sufficiently remove the contaminants of Pt, Ir or the like having a very low ionization tendency, and can hardly reduce them to a level lower than the above-mentioned level, i.e. $1 \times 10^{10}$ atoms/cm$^2$. Even if the contaminants could be removed from the substrate surface, the removed contaminants suspend in the cleaning solution used and readhere on the substrate when the substrate is pulled up from the cleaning solution bath.

Techniques of removing metal contaminants present on silicon wafer or in natural oxide film by using a mixed cleaning solution of hydrochloric acid, hydrofluoric acid and aqueous hydrogen peroxide are disclosed in, for example, JP-A-3-228327 and JP-A-8-31781. All of these techniques, however, are for removal of contaminants present on a silicon wafer on which no device element is formed yet. In JP-A-3-228327 is shown an example of using a cleaning solution of HF:HCl:H$_2$O$_2$:H$_2$O=1:10:20:100 and conducting cleaning at room temperature; in JP-A-8-31781 is shown an example of using a cleaning solution obtained by diluting a 1:1 mixture of 17 wt. % HCl and 25 wt. % HF, with a 100-fold amount of water and then adding thereto H$_2$O$_2$. Both of these techniques are effective for removal of ordinary contaminants, but none of these techniques suggest any effect on the removal of platinum group metal (e.g. Pt or Ir) contaminants present on silicon-based insulating film.

In JP-A-7-45580 is disclosed a technique of removing the metal (e.g. Cu) contaminants adhering on a wafer surface by a sequential washing process, i.e., first removing a natural oxide film formed on a silicon wafer, with dilute hydrofluoric acid, then treating the wafer with a mixture of hydrofluoric acid, hydrochloric acid, hydrogen peroxide and water, and further washing the wafer with a mixture of hydrochloric acid, hydrogen peroxide and water.

In this technique, in the first treatment with dilute hydrofluoric acid, etching of natural oxide film takes place and, simultaneously therewith, the platinum group metal (e.g. Pt or Ir) contaminants present on oxide film, etc. are taken into the hydrofluoric acid solution and suspended therein (these contaminants are stable to hydrofluoric acid); therefore, these contaminants readhere on the wafer when the wafer is pulled up from a cleaning bath, and no sufficient effect for contaminant removal is obtained.

Also in JP-A-6-333898 is disclosed a technique of cleaning the surface of a semiconductor substrate by using a cleaning solution containing (1) a strong acid and an oxidizing agent both for removal of the organic substances and inorganic substances present on semiconductor substrate, (2) a fluorine-containing compound consisting of fluorosulfuric acid or sulfuryl difluoride, capable of releasing fluorine for very slight etching of semiconductor substrate and consequent removal of residue and particles present on semiconductor substrate, and (3) water. In the Example of the document is shown a case of removing a residue adhering on a polysilicon film after dry etching. However, no mention is made on the removal of platinum group metal contaminants.

SUMMARY OF THE INVENTION

The object of the present invention lies in providing (1) a cleaning solution which can reliably remove the platinum group metal (e.g. Pt or Ir) contaminants adhering on a semiconductor substrate or a silicon-based insulating film (e.g. silicon oxide film) formed on the semiconductor substrate and can further prevent the readhesion of the removed contaminants, and (2) a cleaning method using said cleaning solution.

The present inventors made an intensive study in order to achieve the above object. As a result, the present inventors found out that the platinum group metal contaminants present on a semiconductor substrate can be reliably removed and further the readhesion of the removed contaminants can be prevented, by using a cleaning solution which is a mixture of a metal-removing solution and a very small amount of hydrofluoric acid. The above finding has led to the completion of the present invention.

That is, the present invention is directed to a cleaning method for removal of the platinum group metal contaminants present on a semiconductor substrate, which uses a cleaning solution which is a mixture of a metal-removing solution comprising hydrochloric acid and hydrogen peroxide, and a very small amount of hydrofluoric acid, with the proviso that the concentration of hydrochloric acid in the metal-removing solution is in the range of 10 to 25 percents by weight.

The present invention is also directed to a cleaning method for removal of the platinum group metal contaminants present on a semiconductor substrate, which uses a cleaning solution which is a mixture of a metal-removing solution comprising sulfuric acid and hydrogen peroxide, and a very small amount of hydrofluoric acid.

According to the present invention, the platinum group metal contaminants present on a semiconductor substrate or the silicon-based insulating film formed on a semiconductor substrate can be removed reliably and, moreover, the readhesion of the removed contaminants can be prevented; therefore, there occur no secondary contamination in other devices.

BRIEF DESCRIPTION OF THE DRAWINGS

In FIG. 3, numeral 1 refers to a silicon substrate; numeral 2 refers to a diffused layer; numeral 3 refers to a gate insulating film; numeral 4 refers to a gate electrode; numeral 5 refers to a first inter-layer insulating film; numeral 6 refers to a vertical interconnect; numeral 7 refers to a second inter-layer insulating film; numeral 8 refers to a third inter-layer insulating film; numeral 9 refers to a lower-level platinum thin film; numeral 10 refers to a ferroelectric film; numeral 11 refers to an upper-level platinum thin film; numeral 12 refers to a capacitive part; and numeral 13 refers to a metal wiring.

DETAILED DESCRIPTION OF THE PREFERRED EMBODIMENTS

The present invention is hereinafter described in detail.

As the metal-removing solution used in the present invention, there can be mentioned a mixture of an inorganic acid (e.g. hydrochloric acid or sulfuric acid) and hydrogen peroxide. As the inorganic acid, hydrochloric acid is preferred.

The study by the present inventor revealed that platinum group metal contaminants can be removed at a high efficiency by using a cleaning solution containing (1) components (e.g. a combination of hydrochloric acid and hydrogen peroxide) capable of forming hypochlorous acid in the cleaning system and (2) a very small amount, preferably 1% by weight or less of hydrofluoric acid. An aqueous hypochlorous acid solution is very unstable and is ordinarily marketed in the form of a hypochlorite such as sodium hypochlorite, potassium hypochlorite or the like; however, the hypochlorite is not usable in the present invention because it contains a cation which adversely affects semiconductor device elements. In the present invention, use of unstable hypochlorous acid has been made possible by using combined components capable of generating hypochlorous acid in the cleaning system.

Hydrochloric acid reacts with hydrogen peroxide to generate hypochlorous acid. This hypochlorous acid acts on a platinum group metal (e.g. Pt or Ir) to form, via a chloride (e.g. platinum chloride or iridium chloride) or directly, tetrachloroplatinic acid ion ($H[PtCl_4]^-$) or tetrachloroiridic acid ion ($H[IrCl_4]^-$). Since this ion is soluble and does not remain in a suspended form in the cleaning solution, it is thought that the readhesion of such an ion on substrate can be prevented by washing the substrate with water at pulling-up from the cleaning bath.

Figure 1:
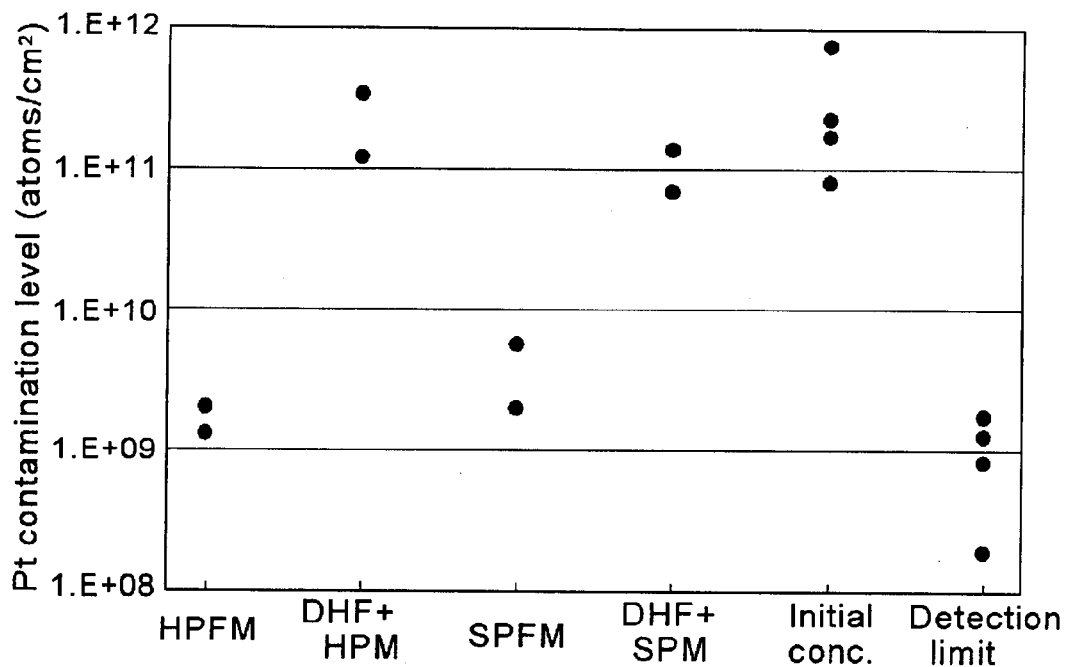
FIG. 1 is a graph showing a difference in Pt contamination level when cleaning solutions of the present invention and cleaning solutions of prior art were used.

FIG. 1 shows a graph of Pt contamination levels when the Pt contaminant adhering on a silicon oxide film formed in a thickness of about 200 nm by CVD was removed using various cleaning solutions of the present invention or prior art. There was substantially no removal effect when a substrate of initial Pt contamination level of about $1 \times 10^{11-12}$ atoms/cm$^2$ was first treated with a 0.1 wt. % aqueous hydrofluoric acid solution (DHF) and then with conventional HPM (HCl:$H_2O_2$:$H_2O$=1:1:5) or SPM ($H_2SO_4$:$H_2O_2$=4:1).

In contrast, the Pt contamination level decreased to lower than $1\times10^{10}$ atoms/cm$^2$ and there was a sufficient removal effect when the substrate was treated with a cleaning solution of the present invention, i.e., HPFM (HCl:H$_2$O$_2$:H$_2$O= 3:1:5=0.1wt. % HF) or SPFM (H$_2$SO$_4$:H$_2$O$_2$=4:1+0.1 wt. % HF). The above treatment was conducted at a solution temperature of 65° C. when a hydrochloric acid-based cleaning solution was used, and at a temperature of 130° C. when a sulfuric acid-based cleaning solution was used. The measurement of Pt contamination level was made by wafer surface treatment using hot aqua regia recovery solution and ICP-MS measurement. In this case, the detection limit was about $1\times10^9$ atoms/cm$^2$.

Figure 2:
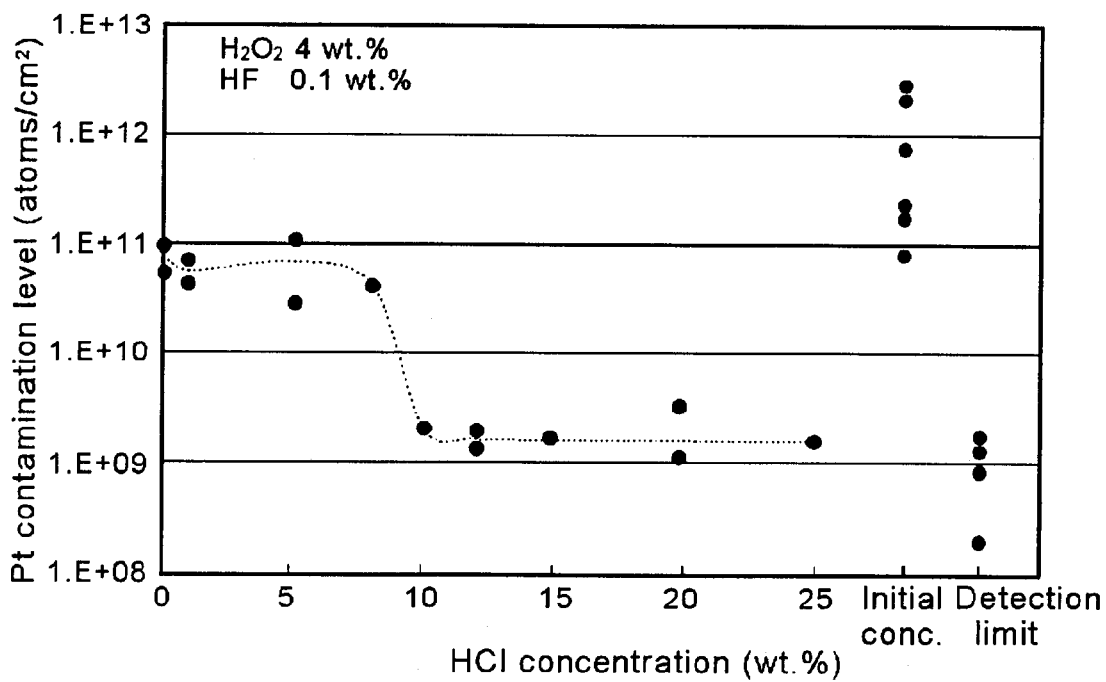
FIG. 2 is a graph showing a difference in removability of Pt contaminant when the concentration of hydrochloric acid was changed.
Figure 3:
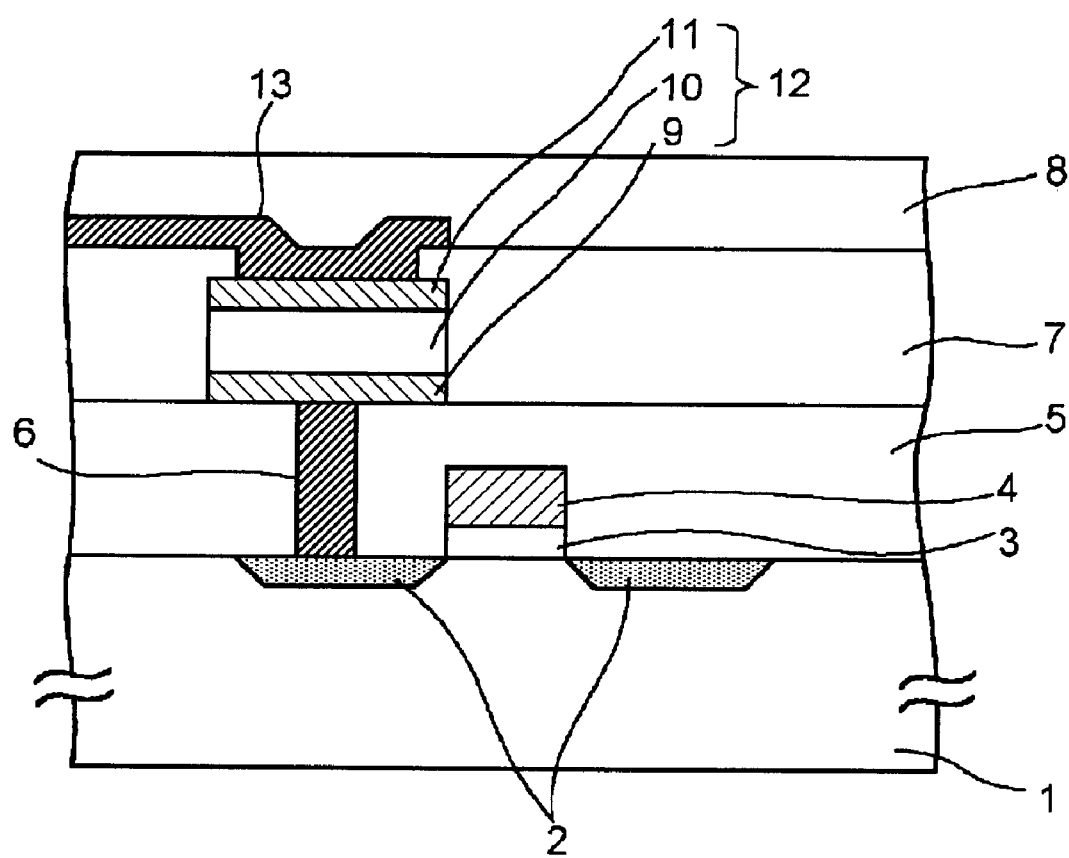
FIG. 3 is a schematic sectional view of an example of the semiconductor device to which the cleaning operation of the present invention is applicable.

FIG. 2 is a graph showing the effect of removal of Pt contaminant when hydrochloric acid concentration was changed. The level of Pt contamination was measured under the conditions of hydrogen peroxide concentration=4% by weight, hydrofluoric acid concentration=0.1% by weight and solution temperature=65° C., at various hydrochloric acid concentrations of 0.085% by weight, 1% by weight, 5% by weight, 8% by weight, 10% by weight, 12% by weight, 15% by weight, 20% by weight and 25% by weight. The Pt removal effect was high in a hydrochloric acid concentration range of 10 to 25% by weight. When the hydrochloric acid concentration is low (the concentration of hydrogen peroxide is relatively high), the once formed hypochlorous acid reacts with hydrogen peroxide and returns to hydrochloric acid and, as a result, the amount of hypochlorous acid formed becomes insufficient. The amount of hydrogen peroxide used is preferably about 2 to 5% by weight.

The amount of hydrofluoric acid used can be selected at an optimum level in view of the desired etching rate of silicon oxide film, but is preferably about 1% by weight or less. An amount larger than that is possible when there is used a silicon-based insulating film other than silicon oxide film, such as silicon nitride film, silicon oxide nitride film or the like. The amount of hydrofluoric acid used is preferably determined so that the etching rate of silicon oxide film becomes 1 to 5 nm/min.

Similarly to conventional cleaning solutions containing hydrogen peroxide, the cleaning solution of the present invention has no sufficiently long life; therefore, it is desired in the present invention to mix hydrogen peroxide right before the cleaning operation.

When a cleaning solution containing hydrochloric acid is used, the cleaning solution is used at a temperature of room temperature (25° C.) to lower than the boiling point of the cleaning solution, preferably about 50 to 70° C. The time of cleaning can be appropriately varied depending upon, for example, the amounts of hydrochloric acid and hydrogen peroxide used and the temperature of cleaning solution used. When the cleaning time is too long, decrease in oxide film thickness by hydrofluoric acid may exceed the allowable limit; too short a cleaning time may not bring about a sufficient cleaning effect. The cleaning time is ordinarily 1 to 15 minutes, preferably about 5 to 10 minutes.

What is claimed is:

1. A cleaning method for removal of the platinum group metal contaminants present on a semiconductor substrate, comprising applying to the semiconductor substrate a cleaning solution which is a mixture of a metal-removing solution comprising hydrochloric acid and hydrogen peroxide, and a very small amount of hydrofluoric acid, with the proviso that the concentration of hydrochloric acid in the metal-removing solution is in the range of 10 to 25 percents by weight.

2. A cleaning method according to claim 1, wherein the cleaning solution is used in a temperature range from room temperature to lower than the boiling point of the cleaning solution.

3. A cleaning method according to claim 1, wherein on the semiconductor substrate a silicon-based insulating film is formed.

4. A cleaning method according to claim 3, wherein the silicon-based insulating film is selected from the group consisting of a silicon oxide film, a silicon nitride film and a silicon oxide nitride film.

5. A cleaning method for removal of the platinum group metal contaminants present on a semiconductor substrate, comprising applying to the semiconductor substrate a cleaning solution which is a mixture of a metal-removing solution comprising sulfuric acid and hydrogen peroxide, and a very small amount of hydrofluoric acid.

6. A cleaning method according to claim 5, wherein the cleaning solution is used in a temperature range from room temperature to lower than the boiling point of the cleaning solution.

7. A cleaning method according to claim 5, wherein on the semiconductor substrate a silicon-based insulating film is formed.

8. A cleaning method according to claim 7, wherein the silicon-based insulating film is selected from the group consisting of a silicon oxide film, a silicon nitride film and a silicon oxide nitride film.

9. A cleaning solution used for removal of the platinum group metal contaminants present on the silicon-based insulating film formed on a semiconductor substrate, which contains 10 to 25% by weight of hydrochloric acid, 2 to 5% by weight of hydrogen peroxide and 0.01 to 1% by weight of hydrofluoric acid.

10. A cleaning solution used for removal of the platinum group metal contaminants present on the silica-based insulating film formed on a semiconductor substrate, which contains 10 to 25% by weight of hydrochloric acid, 2 to 5% by weight of hydrogen peroxide and hydrofluoric acid of such an amount that the etching rate of the silicon-based insulating film becomes 1 to 5 nm/min.

11. The method of claim 1, wherein the mixture of the metal-removing solution and the hydrofluoric acid contains hydrofluoric acid in a range of 0.01 to 1.0% by weight.

* * * * *